(12) United States Patent
Kanbara

(10) Patent No.: US 10,390,427 B2
(45) Date of Patent: Aug. 20, 2019

(54) PHOTOSENSITIVE GLASS PASTE AND ELECTRONIC COMPONENT

(71) Applicant: Murata Manufacturing Co., Ltd., Kyoto-fu (JP)

(72) Inventor: Hiroyuki Kanbara, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/937,692

(22) Filed: Mar. 27, 2018

(65) Prior Publication Data

US 2018/0220529 A1   Aug. 2, 2018

Related U.S. Application Data

(63) Continuation of application No. PCT/JP2016/074624, filed on Aug. 24, 2016.

(30) Foreign Application Priority Data

Sep. 28, 2015   (JP) ................. 2015-189850

(51) Int. Cl.
*B32B 17/06* (2006.01)
*B32B 15/04* (2006.01)
(Continued)

(52) U.S. Cl.
CPC ........... *H05K 1/0306* (2013.01); *C03C 3/062* (2013.01); *C03C 3/089* (2013.01); *C03C 4/04* (2013.01); *C03C 8/22* (2013.01); *C03C 8/24* (2013.01); *C03C 14/006* (2013.01); *G03F 7/0047* (2013.01); *G03F 7/029* (2013.01); *G03F 7/031* (2013.01); *G03F 7/033* (2013.01);
(Continued)

(58) Field of Classification Search
USPC ................................. 428/426, 688
See application file for complete search history.

(56) References Cited

U.S. PATENT DOCUMENTS

| | | | |
|---|---|---|---|
| 2001/0014429 A1* | 8/2001 | Iha ............... | C03C 8/16 430/270.1 |
| 2009/0035452 A1* | 2/2009 | Kusano .......... | G03F 7/0007 427/58 |
| 2010/0273632 A1 | 10/2010 | Wang et al. | |

FOREIGN PATENT DOCUMENTS

| JP | 2001-114554 A | 4/2001 |
|---|---|---|
| JP | 2001-210141 A | 8/2001 |

(Continued)

OTHER PUBLICATIONS

International Search Report issued in PCT/JP2016/074624; dated Oct. 11, 2016.

(Continued)

*Primary Examiner* — Lauren R Colgan
(74) *Attorney, Agent, or Firm* — Studebaker & Brackett PC

(57) ABSTRACT

A photosensitive glass paste contains a photosensitive organic component and an inorganic component containing a glass powder having a high softening point, a glass powder having a low softening point, and a ceramic filler. The ceramic filler has a thermal expansion coefficient of $10 \times 10^{-6}/°C$. to $16 \times 10^{-6}/°C$., the inorganic component contains 30% to 50% by volume of the ceramic filler, and the inorganic component contains 0.5% to 10% by volume of the glass powder having a low softening point.

8 Claims, 1 Drawing Sheet

(51) Int. Cl.
  *H05K 1/03*   (2006.01)
  *C03C 8/22*   (2006.01)
  *C03C 8/24*   (2006.01)
  *H01B 3/02*   (2006.01)
  *H05K 3/46*   (2006.01)
  *C03C 3/062*  (2006.01)
  *C03C 3/089*  (2006.01)
  *C03C 4/04*   (2006.01)
  *C03C 14/00*  (2006.01)
  *G03F 7/004*  (2006.01)
  *G03F 7/029*  (2006.01)
  *G03F 7/031*  (2006.01)
  *G03F 7/033*  (2006.01)

(52) U.S. Cl.
  CPC ............. *H01B 3/02* (2013.01); *H05K 1/03* (2013.01); *H05K 3/46* (2013.01); *C03C 2214/16* (2013.01); *H05K 2201/0104* (2013.01); *H05K 2201/017* (2013.01); *H05K 2201/068* (2013.01); *H05K 2203/1126* (2013.01)

(56) References Cited

FOREIGN PATENT DOCUMENTS

| | | |
|---|---|---|
| JP | 3460657 B2    | 10/2003 |
| JP | 2004-206988 A | 7/2004  |
| JP | 2006-126716 A | 5/2006  |
| JP | 2008-242461 A | 10/2008 |
| JP | 4898729 B2    | 3/2012  |
| JP | 2014-241258 A | 12/2014 |
| WO | 2008/093669 A1 | 8/2008 |

OTHER PUBLICATIONS

Written Opinion issued in PCT/JP2016/074624; dated Oct. 11, 2016.

* cited by examiner

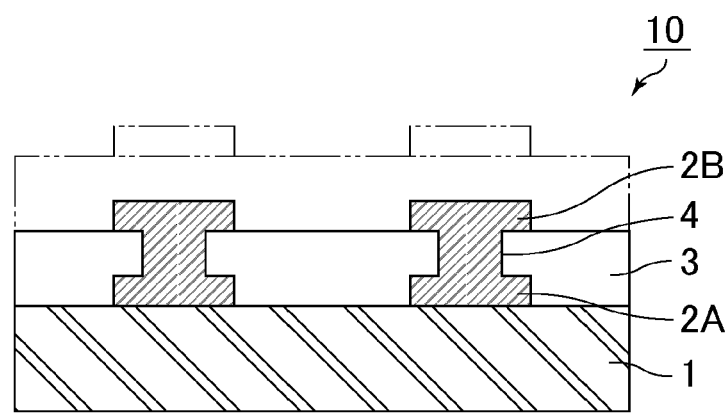

PHOTOSENSITIVE GLASS PASTE AND ELECTRONIC COMPONENT

CROSS-REFERENCE TO RELATED APPLICATION

This application claims benefit of priority to International Patent Application No. PCT/JP2016/074624, filed Aug. 24, 2016, and to Japanese Patent Application No. 2015-189850, filed Sep. 28, 2015, the entire contents of each are incorporated herein by reference.

BACKGROUND

Technical Field

The present disclosure relates to a photosensitive glass paste and an electronic component.

Background Art

An insulating paste that contains an organic component and an inorganic component containing a glass powder is used as an insulating material in electronic components and substrates of multi-layered circuit boards or the like.

Japanese Patent No. 3460657 discloses a photosensitive glass paste that contains a photosensitive organic component and an inorganic component that contains a low-melting glass powder and a high-melting glass powder. Japanese Patent No. 3460657 further discloses that the photosensitive glass paste contains ceramic particles or crystalline particles as an inorganic component, the softening point of the low-melting glass powder is 400 to 600° C., the high-melting glass powder is a $SiO_2$—$B_2O_3$—$K_2O$-based glass powder, and the difference in softening point between the low-melting glass powder and the high-melting glass powder is 300° C. or higher.

Japanese Patent No. 4898729 discloses a photosensitive paste composition that contains an organic-inorganic complex sol and an inorganic substance. Japanese Patent No. 4898729 further discloses that the inorganic substance contains a low-melting glass powder and a high-melting glass powder.

SUMMARY

The photosensitive glass paste in Japanese Patent No. 3460657 is a glass paste for a multi-layered circuit board and has a composition such that the glass paste is applied to a substrate made of a material having a low thermal expansion coefficient, typically an alumina substrate, and is subsequently fired to form an insulating layer. The photosensitive paste composition in Japanese Patent No. 4898729 is a glass paste for barrier ribs of a plasma display panel and has a composition such that the glass paste is applied to mainly a glass substrate and is subsequently fired to form barrier ribs. These glass pastes can form a dense insulating coating film that retains a pattern profile due to containing two glass powders having different softening points.

In this way, a glass paste has been used to form an insulating layer on an alumina substrate or on a glass substrate. On the other hand, a method for producing an electronic component by forming an insulating layer on a substrate made of a material having a high thermal expansion coefficient, such as a ferrite substrate, has been studied. Examples of the electronic component include isolators, LC filters, ferrite multi-layered substrates, and common mode choke coils.

The present inventor has tried to form an insulating layer on a substrate made of a material having a high thermal expansion coefficient, such as a ferrite substrate, by using the glass paste in Japanese Patent No. 3460657 or Japanese Patent No. 4898729. However, it has been found that the large difference in thermal expansion coefficient between an inorganic component in the glass paste and the substrate causes a problem such as warping of the substrate during firing or separation of the insulating layer from the substrate.

The present disclosure has been made to solve the foregoing problems. An object of the present disclosure is to provide a photosensitive glass paste that enables prevention of warping of a substrate during firing, prevention of separation of an insulating layer from the substrate, and formation of a highly insulative dense insulating layer.

The present disclosure provides a photosensitive glass paste containing a photosensitive organic component and an inorganic component that contains a glass powder having a high softening point, a glass powder having a low softening point, and a ceramic filler. The ceramic filler has a thermal expansion coefficient of $10 \times 10^{-6}/°C$. or more and $16 \times 10^{-6}/°C$. or less (i.e., from $10 \times 10^{-6}/°C$. to $16 \times 10^{-6}/°C$.), the inorganic component contains 30% by volume or more and 50% by volume or less (i.e., from 30% to 50%) of the ceramic filler, and the inorganic component contains 0.5% by volume or more and 10% by volume or less (i.e., from 0.5% to 10%) of the glass powder having a low softening point.

As described above, the photosensitive glass paste according to the present disclosure contains a ceramic filler having a high thermal expansion coefficient in addition to two kinds of glass powders that are a glass powder having a high softening point and a glass powder having a low softening point. In the photosensitive glass paste according to the present disclosure, the ceramic filler is set to have a thermal expansion coefficient of $10 \times 10^{-6}/°C$. or more and $16 \times 10^{-6}/°C$. or less (i.e., from $10 \times 10^{-6}/°C$. to $16 \times 10^{-6}/°C$.), and the inorganic component is set to contain 30% by volume or more and 50% by volume or less (i.e., from 30% to 50%) of the ceramic filler, thereby increasing the thermal expansion coefficient of the glass paste. Even when an insulating layer is formed on a substrate made of a material having a high thermal expansion coefficient, such as ferrite, the use of the glass paste having a high thermal expansion coefficient enables prevention of warping of the substrate during firing and prevention of separation of the insulating layer from the substrate.

In the photosensitive glass paste according to the present disclosure, the inorganic component is set to contain 0.5% by volume or more and 10% by volume or less (i.e., from 0.5% to 10%) of the glass powder having a low softening point to thereby form a dense insulating layer having high insulating properties. Furthermore, when the photosensitive glass paste is subjected to firing in the presence of an electrode made of silver or gold, diffusion of the electrode component into the insulating layer can be prevented.

In the photosensitive glass paste according to the present disclosure, the difference in softening point between the glass powder having a high softening point and the glass powder having a low softening point is preferably 50° C. or higher and 240° C. or lower (i.e., from 50° C. to 240° C.). The difference in softening point between the glass powder having a high softening point and the glass powder having a low softening point is set to 50° C. or higher and 240° C.

or lower (i.e., from 50° C. to 240° C. to thereby facilitate softening of the whole glass powders and prevent diffusion of the electrode component into the insulating layer.

In the photosensitive glass paste according to the present disclosure, it is preferable that the glass powder having a high softening point be a $SiO_2$—$B_2O_3$—$K_2O$-based glass powder and that the glass powder having a low softening point be a $SiO_2$—$B_2O_3$—$Bi_2O_3$-based glass powder. The use of the glass powders with the above compositions as a glass powder having a high softening point and a glass powder having a low softening point easily prevents diffusion of the electrode component into the insulating layer.

An electronic component according to the present disclosure includes an insulating layer disposed on a ceramic substrate and produced by firing the photosensitive glass paste according to the present disclosure. As described above, an insulating layer produced by firing the photosensitive glass paste according to the present disclosure is dense and highly insulative and is unlikely to become separated from the substrate even if it is formed on a substrate made of a material having a high thermal expansion coefficient, such as ferrite. Thus, the insulating layer is highly reliable in insulating properties and prevents occurrence of insulation failure as a whole electronic component.

According to the present disclosure, there is provided a photosensitive glass paste that prevents warping of a substrate during firing and separation of an insulating layer from the substrate and that forms a highly insulative dense insulating layer.

BRIEF DESCRIPTION OF THE DRAWING

The FIGURE is a schematic sectional view of an example of an electronic component.

DETAILED DESCRIPTION

Hereinafter, a photosensitive glass paste and an electronic component according to the present disclosure will be described. However, the present disclosure is not limited to the following features, and the features may be appropriately changed and modified without departing from the scope of the present disclosure. A combination of two or more of the following desirable features according to the present disclosure also falls within the scope of the present disclosure.

<Photosensitive Glass Paste>

A photosensitive glass paste according to the present disclosure contains a photosensitive organic component and an inorganic component that contains a glass powder having a high softening point, a glass powder having a low softening point, and a ceramic filler.

[Inorganic Component]

(Glass Powder Having High Softening Point)

The softening point of the glass powder having a high softening point is not particularly limited. From the viewpoint of preventing a decrease in viscosity of the glass paste during firing, the softening point of the glass powder having a high softening point preferably has a lower limit of 720° C., more preferably 760° C. and preferably has an upper limit of 940° C., more preferably 900° C. The softening point of the glass powder having a high softening point is measured by using a thermomechanical analysis apparatus (4000S, produced by MAC Science Co., Ltd.) in accordance with JIS R 3103-3.

The glass powder having a high softening point is not particularly limited, and examples thereof include powders of $SiO_2$—$B_2O_3$—$K_2O$-based glass, $SiO_2$—$B_2O_3$—$Al_2O_3$-based glass, and $SiO_2$—$B_2O_3$—CaO—$K_2O$—$Na_2O$—$Al_2O_3$-based glass. A powder mixture of two or more of the foregoing may be used. Of these, $SiO_2$—$B_2O_3$—$K_2O$-based glass powders are preferable.

The content of the glass powder having a high softening point in the inorganic component preferably has a lower limit of 40% by volume, more preferably 45% by volume and preferably has an upper limit of 69.5% by volume, more preferably 65% by volume.

(Glass Powder Having Low Softening Point)

The softening point of the glass powder having a low softening point is not particularly limited, provided that it is lower than the softening point of the glass powder having a high softening point. From the viewpoint of facilitating softening of the whole glass powders and preventing diffusion of an electrode component into the insulating layer, the softening point of the glass powder having a low softening point preferably has a lower limit of 400° C., more preferably 450° C. and preferably has an upper limit of 710° C., more preferably 660° C. The softening point of the glass powder having a low softening point is measured by using a thermomechanical analysis apparatus (4000S, produced by MAC Science Co., Ltd.) in accordance with JIS R 3103-3.

The difference in softening point between the glass powder having a high softening point and the glass powder having a low softening point preferably has a lower limit of 50° C., more preferably 100° C. and preferably has a higher limit of 240° C.

The glass powder having a low softening point is not particularly limited, and examples thereof include powders of $SiO_2$—$B_2O_3$—$Bi_2O_3$-based glass, $SiO_2$—$B_2O_3$—$Li_2O$—CaO-based glass, and $SiO_2$—$B_2O_3$—ZnO—CaO-based glass. A powder mixture of two or more of the foregoing may be used. Of these, $SiO_2$—$B_2O_3$—$Bi_2O_3$-based glass powders are preferable.

The content of the glass powder having a low softening point in the inorganic component preferably has a lower limit of 0.5% by volume, preferably 2% by volume and has an upper limit of 10% by volume, preferably 6% by volume.

(Ceramic Filler)

In the present Description, a ceramic filler is an aggregate that is used for forming a structure having form accuracy and size accuracy and that does not melt during firing of the paste.

The photosensitive glass paste according to the present disclosure includes a ceramic filler having a thermal expansion coefficient of $10 \times 10^{-6}$/° C. or more and $16 \times 10^{-6}$/° C. or less. The thermal expansion coefficient of the ceramic filler preferably has a lower limit of $11 \times 10^{-6}$/° C., more preferably $12 \times 10^{-6}$/° C. and preferably has an upper limit of $15 \times 10^{-6}$/° C., more preferably $14 \times 10^{-6}$/° C. The thermal expansion coefficient is the average of thermal expansion coefficients measured over the temperature range of 40° C. or more and 400° C. or less (i.e., from 40° C. to 400° C.) by using a thermomechanical analysis apparatus (4000S, produced by MAC Science Co., Ltd.) in accordance with JIS R 3102.

The type of the ceramic filler is not particularly limited, provided that the thermal expansion coefficient is $10 \times 10^{-6}$/° C. or higher and $16 \times 10^{-6}$/° C. or lower (i.e., from $10 \times 10^{-6}$/° C. to $16 \times 10^{-6}$/° C.). Examples of the ceramic filler include quartz, zirconia, magnesia, forsterite, beryllia, nepheline, leucite, and sodalite. Two or more of the foregoing may be used in combination.

The content of the ceramic filler in the inorganic component has a lower limit of 30% by volume, preferably 35% by volume and has an upper limit of 50% by volume, preferably 40% by volume.

Each of the glass powder having a high softening point, the glass powder having a low softening point, and the ceramic filler in the inorganic component preferably has an average particle size (median diameter, $D_{50}$) of 0.5 μm or more and 5.0 μm or less (i.e., from 0.5 μm to 5.0 μm). Incidentally, $D_{50}$ can be obtained by calculating a number-average particle diameter from the particle size distribution measured in the range of 0.02 μm to 1400 μm by a laser diffraction-scattering technique by using, for example, a particle size distribution analyzer MT3300-EX produced by Bell Microtrac Inc.

As described above, in the photosensitive glass paste according to the present disclosure, the expansion coefficient of the glass paste is increased by setting the thermal expansion coefficient of the ceramic filler to be $10 \times 10^{-6}/°$ C. or more and $16 \times 10^{-6}/°$ C. or less (i.e., from $10 \times 10^{-6}/°$ C. to $16 \times 10^{-6}/°$ C.) and the ceramic filler content in the inorganic component to be 30% by volume or more and 50% (i.e., from 30% to 50%) by volume or less. Another method for increasing the thermal expansion coefficient of the glass paste may be a method of increasing the thermal expansion coefficient of the glass powder constituting a main matrix. However, in general, the glass powder having a high thermal expansion coefficient increases the viscosity of the paste in the case that the glass powder contains a divalent ion of calcium or magnesium, for example. In addition, the glass powder having a high thermal expansion coefficient needs to be fired at a temperature lower than the sintering temperature for an electrode material, such as silver or copper. Therefore, it is difficult to use the glass powder having a high thermal expansion coefficient as the glass powder constituting a main matrix.

(Other Inorganic Powder)

In the photosensitive glass paste according to the present disclosure, the inorganic component preferably contains only the above-described glass powder having a high softening point, glass powder having a low softening point, and ceramic filler, but may contain another inorganic powder (e.g., a ceramic filler having a thermal expansion coefficient of less than $10 \times 10^{-6}/°$ C. or a ceramic filler having a thermal expansion coefficient of more than $16 \times 10^{-6}/°$ C.). In this case, the content of this other inorganic powder in the inorganic component is preferably less than 10% by volume.

In the photosensitive glass paste according to the present disclosure, the content of the inorganic component preferably has a lower limit of 45 parts by weight, more preferably 50 parts by weight and preferably has an upper limit of 65 parts by weight, more preferably 60 parts by weight.

[Organic Component]

In the photosensitive glass paste according to the present disclosure preferably, the photosensitive organic component preferably contains, for example, a polymer having functional groups in side chains (e.g., a methacrylic acid-methyl methacrylate copolymer), a photoreactive compound (monomer), a photo-polymerization initiating agent, and a solvent.

In the photosensitive glass paste according to the present disclosure, the content of the organic component preferably has a lower limit of 35 parts by weight, more preferably 40 parts by weight and preferably has an upper limit of 55 parts by weight, more preferably 50 parts by weight.

The photosensitive glass paste according to the present disclosure may be produced by mixing the above-described materials in a predetermined proportion. The mixing order and method are not particularly limited, and for example, a method in which mixing and dispersing are performed by using a three-roll mill may be used.

The photosensitive glass paste according to the present disclosure is used to print a paste layer on the substrate by screen printing, and the solvent is removed by performing drying, such as hot air drying, to thereby form a coating film. After performing drying, photo-curing may be performed by using a light source (a light source having a main peak at 365 nm is preferable), such as a high-pressure mercury lamp or a UV-LED.

<Electronic Component>

The electronic component according to the present disclosure includes an insulating layer disposed on a ceramic substrate and produced by firing the photosensitive glass paste according to the present disclosure.

The type of ceramic substrate is not particularly limited, however, a substrate made of ceramic having a thermal expansion coefficient of $10 \times 10^{-6}/°$ C. or more is preferable. Examples of such a ceramic substrate include substrates made of ferrite, zirconia, calcium titanate, or barium titanate. As described above, an insulating layer produced by firing the photosensitive glass paste according to the present disclosure is unlikely to become separated from the substrate, even in the case that the insulating layer is formed on the ceramic substrate having a high thermal expansion coefficient.

Examples of the electronic component that includes an insulating layer on a ceramic substrate having a high thermal expansion coefficient include isolators, LC filters, ferrite multi-layered substrates, and common mode choke coils.

Hereinafter, an embodiment of the electronic component will be described with reference to the drawing; however, the configuration of the electronic component and the method for producing the electronic component are not limited to the description below.

The FIGURE is a schematic sectional view of an example of the electronic component. An electronic component 10 illustrated in the FIGURE includes a ceramic substrate 1 and a multilayer body in which a predetermined number of wiring patterns (internal electrodes 2A, 2B, and the like) are formed in insulating layers 3.

Hereinafter, an example of the method for producing the electronic component 10 illustrated in the FIGURE will be described. First, a conductive paste layer having a pattern is formed by applying a conductive paste to the ceramic substrate 1, such as a ferrite substrate, by screen printing. After drying is performed, the internal electrodes 2A of a first layer are formed by firing, for example, at a temperature of 800° C. or higher and 850° C. or lower (i.e., from 800° C. to 850° C.) in air. Next, a photosensitive glass paste layer is formed by applying a photosensitive glass paste to the entirety of a surface of the substrate 1 by screen printing so as to cover the internal electrodes 2A. After drying is performed, the photosensitive glass paste layer is exposed to a light through a photomask to form, for example, a pattern for via-holes having a diameter of 60 μm. Then, development is performed to remove unnecessary portions, and furthermore, firing is performed at a temperature of 800° C. or higher and 850° C. or lower (i.e., from 800° C. to 850° C.) in air to thereby form the insulating layer 3 having via holes 4. The formed insulating layer 3 serves as an insulating layer between the wiring patterns (internal electrodes 2A and 2B). The film thickness of the insulating layer 3 is preferably 10 m or more and 30 μm or less (i.e., from 10 μm to 30 μm). Subsequently, a conductive paste is applied to the insulating layer 3 by screen printing to thereby fill the via holes 4 with the conductive paste and form a conductive paste layer having a pattern on the insulating layer 3. After drying, firing is performed to form internal electrodes 2B of a second layer. The internal electrodes 2A of the first layer and the internal electrodes 2B of the second layer are connected via the electric conductors in the via holes 4.

By repeating such a process, the multilayer body in which a predetermined number of wiring patterns are formed in the insulating layers is produced. To a side surface of the obtained multilayer body, a paste containing a silver powder and a glass frit is applied, firing at 600° C. or more and 750° C. or less (i.e., from 600° C. to 750° C.) is performed, and if necessary, nickel plating and tin plating are sequentially performed by electro plating, thereby producing an external electrode. In this way, the electronic component 10 is produced.

EXAMPLES

Hereinafter, examples that more specifically disclose the photosensitive glass paste according to the present disclosure will be described. The present disclosure is not limited to the examples.

Glasses having a high softening point, glasses having a low softening point, and ceramic fillers shown in Table 1 were prepared. Quartz, alumina, zirconia, nepheline, magnesia were prepared as ceramic fillers. Table 1 shows the softening point, the thermal expansion coefficient, the average particle diameter, and the component of each glass and the thermal expansion coefficient and the average particle diameter of each ceramic filler.

(1) Production of Photosensitive Glass Paste

Materials in the proportions described below were mixed to thereby produce a photosensitive glass paste. Specifically, materials were weighed so as to satisfy the proportions below, the weighed materials were stirred by using a planetary mixer for 30 minutes and kneaded four times by being passed through a three-roll mill, thereby producing a photosensitive glass paste.

[Inorganic Component]

Inorganic powder in proportion described in Table 2 55 parts by weight in total

The amount of each powder in volume % shown in Table 2 represents the amount of each powder in volume % in the inorganic component, which was calculated from the weight of each powder and the density of materials constituting each powder.

[Organic Component]

Alkali-soluble polymer: methacrylic acid-methyl methacrylate copolymer 30.1 parts by weight Monomer: trimethylolpropane triacrylate 10 parts by weight Solvent: pentamethylene glycol 3 parts by weight Photo polymerization initiating agent (1): 2-methyl-1-[4-(methylthio)phenyl]-2-morpholino propan-1-on 0.5 parts by weight Photo polymerization initiating agent (2): 2,4-diethylthioxanthone 0.3 parts by weight Photo polymerization initiating agent (3): Bis(2,4,6-trimethylbenzoyl)phenylphosphyne oxide 0.8 parts by weight Yellow dye: Oil Yellow 129 (trade name: produced by Orient Chemical Industries Co., Ltd.) 0.3 parts by weight (2) Evaluation of Photosensitive Glass Paste First, a conductive silver paste was applied to a Fe—Ca—Y-based ferrite substrate with 4-inch sides (thickness: 0.15 mm) by screen printing and dried at 90° C. for 10 minutes, thereby forming a film having a thickness of 10 μm. Thereafter, firing at 850° C. in air was performed to form a conductive wiring. Next, to the ferrite substrate on which the conductive wiring was formed, the photosensitive glass paste produced in (1) was applied by screen printing and dried at 60° C. for 10 minutes, thereby forming a film having a thickness of 40 μm. Then, exposure to i-line (wavelength: 365 nm) was performed at a light exposure of 100 mJ/cm$^2$ through a photomask in which openings had a width of 60 μm, and the unexposed portions were then removed by using a triethanolamine aqueous solution as a developer. The resultant insulating film was fired at 850° C. in air. Furthermore, by a similar process, a conductive wiring was formed on the insulating layer, thereby producing an electronic component.

Such electronic components obtained were evaluated in terms of electrode diffusion into the insulating layer, insulating properties, and warping of the substrate. The results are shown in Table 2. Electrode diffusion into the insulating layer was evaluated by analyzing a section of insulating layer by WDX (wavelength-dispersed X-ray spectrometer) mapping. Cases where the diffusion length of silver was 10

TABLE 1

| Sample number | Type | Glass softening point (° C.) | Thermal expansion coefficient ($\times 10^{-6}$/° C.) (40 to 400° C.) | Average particle diameter (μm) | Component (weight ratio) |
|---|---|---|---|---|---|
| 1 | Glass having a high softening point | 760 | 2.8 | 1.0 | $SiO_2:B_2O_3:K_2O$ = 79:19:2 |
| 2 | Glass having a high softening point | 790 | 2.5 | 3.0 | $SiO_2:B_2O_3:K_2O$ = 83:16:1 |
| 3 | Glass having a high softening point | 820 | 5.0 | 1.5 | $SiO_2:B_2O_3:Na_2O:K_2O:CaO$ = 55:17:6:10:12 |
| 4 | Glass having a low softening point | 521 | 6.9 | 1.5 | $SiO_2:B_2O_3:Bi_2O_3:Al_2O_3$ = 3:24:70:3 |
| 5 | Glass having a low softening point | 710 | 3.0 | 2.5 | $SiO_2:B_2O_3:ZnO:Li_2O:CaO$ = 51:21:4:11:13 |
| 6 | Quartz | | 10.7 | 2.0 | |
| 7 | Alumina | | 7.0 | 1.0 | |
| 8 | Zirconia | | 10.5 | 3.0 | |
| 9 | Nepheline | | 16.0 | 2.5 | |
| 10 | Magnesia | | 13.0 | 4.0 | |

μm or less were evaluated as Good, cases where the diffusion length of silver was more than 10 μm and 15 μm or less (i.e., from more than 10 μm to 15 μm) were evaluated Fair, and cases where the diffusion length of silver was more than 15 μm were evaluated as Poor. Insulating properties were evaluated on the basis of the breakdown voltage of the insulating layer produced in (2), the breakdown voltage being measured by using a high voltage power supply (APX-40K3.75PXR, produced by MAX-Electronics Co, Ltd.). Cases where the breakdown voltage was 20 V/μmol or more were evaluated as Good, cases where the breakdown voltage was 10 V/μm or more and less than 20 V/μm (i.e., from 10 V/μm to less than 20 V/μm) were evaluated as Fair, and cases where the breakdown voltage was lower than 10 V/μm were evaluated as Poor. Warping of the substrate was measured by using a non-contact 3D measuring instrument (NH-3SP, produced by Mitaka Kohki Co., Ltd.). Cases where the warp length was 1 mm or less were evaluated as Good, cases where the warp length was more than 1 mm and 1.5 mm or less (i.e., from more than 1 mm to 1.5 mm) were evaluated as Fair, and cases where the warp length was more than 1.5 mm were evaluated as Poor.

present disclosure, and thus, a dense insulating film was not formed by firing, and the insulating film showed low insulating properties.

In Comparative Example 2, the amount of the glass powder having a low softening point was 12.0% by volume, which is higher than the range specified in the present disclosure, and thus, a large amount of the electrode component diffused into the insulating layer although a dense insulating film was formed by firing.

In Comparative Examples 3 and 6, the amounts of the ceramic fillers were 20.7% by volume and 13.7% by volume, respectively, which are lower than the range specified in the present disclosure, and thus, each insulating layer had a lower thermal expansion coefficient, thereby causing the substrate to warp after firing.

In Comparative Example 4, the amount of the ceramic filler was 56.7% by volume, which is higher than the range specified in the present disclosure, and thus, the amount of the glass components in the paste was decreased, and as a result, a dense insulating film was not formed by firing, and the insulating film showed low insulating properties.

TABLE 2

| | Glass powder having high softening point | | Glass powder having low softening point | | Softening point | Ceramic filler | | Electrode | | Substrate |
|---|---|---|---|---|---|---|---|---|---|---|
| | Sample number | Amount (volume %) | Sample number | Amount (volume %) | temperature difference (° C.) | Sample number | Amount (volume %) | diffusion suppression | Insulating properties | warping suppression |
| Example 1 | 1 | 62.0 | 4 | 2.9 | 239 | 6 | 35.1 | Good | Good | Good |
| Example 2 | 1 | 64.3 | 4 | 0.5 | 239 | 6 | 35.2 | Good | Good | Good |
| Example 3 | 1 | 56.5 | 4 | 10.0 | 239 | 6 | 33.5 | Good | Good | Good |
| Example 4 | 2 | 59.2 | 4 | 5.7 | 274 | 6 | 35.1 | Good | Fair | Good |
| Example 5 | 1 | 63.8 | 4 | 6.1 | 239 | 6 | 30.1 | Good | Good | Good |
| Example 6 | 1 | 45.1 | 4 | 5.1 | 239 | 6 | 49.8 | Good | Good | Good |
| Example 7 | 1 | 62.0 | 4 | 2.9 | 239 | 8 | 35.1 | Good | Good | Good |
| Example 8 | 3 | 59.2 | 4 | 5.7 | 299 | 6 | 35.1 | Good | Fair | Good |
| Example 9 | 1 | 54.6 | 5 | 8.2 | 50 | 6 | 37.2 | Good | Good | Good |
| Example 10 | 1 | 59.2 | 4 | 5.7 | 239 | 9 | 35.1 | Good | Good | Good |
| Example 11 | 1 | 62.0 | 4 | 2.9 | 239 | 10 | 35.1 | Good | Good | Good |
| Comparative Example 1 | 1 | 64.4 | 4 | 0.3 | 239 | 6 | 35.3 | Good | Poor | Good |
| Comparative Example 2 | 1 | 55.2 | 4 | 12.0 | 239 | 6 | 32.8 | Poor | Good | Good |
| Comparative Example 3 | 1 | 77.6 | 4 | 1.7 | 239 | 6 | 20.7 | Good | Good | Poor |
| Comparative Example 4 | 1 | 39.5 | 4 | 3.8 | 239 | 6 | 56.7 | Good | Poor | Good |
| Comparative Example 5 | 1 | 62.0 | 4 | 2.9 | 239 | 7 | 35.1 | Good | Good | Poor |
| Comparative Example 6 | 1 | 85.2 | 4 | 1.1 | 239 | 6 | 13.7 | Good | Good | Poor |

As shown in Table 2, in Examples 1 to 11 in which the inorganic component satisfies the requirement of the present disclosure, it was confirmed that the diffusion of the electrode into the insulating layer was low, insulating properties were high, and the degree of the warping of the substrate was low. Particularly, in Examples 1 to 3, 5 to 7, and 9 to 11, the difference in softening point between the glass powder having a high softening point and the glass powder having a low softening point was 50° C. or higher and 240° C. or lower (i.e., from 50° C. to 240° C.), and thus, glass softening was sufficiently facilitated by firing, thereby providing a more dense insulating film having higher insulting properties.

In contrast, in Comparative Example 1, the amount of the glass powder having a low softening point was 0.3% by volume, which is lower than the range specified in the In Comparative Example 5, alumina, which has a low thermal expansion coefficient, was used as a ceramic filler, and thus, the substrate warped after firing.

What is claimed is:
1. A photosensitive glass paste comprising a photosensitive organic component and an inorganic component that contains a glass powder having a high softening point, a glass powder having a low softening point that is lower than the high softening point, and a ceramic filler,
   wherein the ceramic filler has a thermal expansion coefficient of from $10 \times 10^{-6}$/° C. to $16 \times 10^{-6}$/° C.,
   the inorganic component contains from 30% to 50% by volume of the ceramic filler, and
   the inorganic component contains from 0.5% to 10% by volume of the glass powder having a low softening point.

2. The photosensitive glass paste according to claim 1, wherein a difference in softening point between the glass powder having a high softening point and the glass powder having a low softening point is from 50° C. to 240° C.

3. An electronic component comprising an insulating layer disposed on a ceramic substrate and produced by firing the photosensitive glass paste according to claim 2.

4. The photosensitive glass paste according to claim 2, wherein:
  the glass powder having a high softening point is a $SiO_2$—$B_2O_3$—$K_2O$-based glass powder, and
  the glass powder having a low softening point is a $SiO_2$—$B_2O_3$—$Bi_2O_3$-based glass powder.

5. An electronic component comprising an insulating layer disposed on a ceramic substrate and produced by firing the photosensitive glass paste according to claim 4.

6. The photosensitive glass paste according to claim 1, wherein:
  the glass powder having a high softening point is a $SiO_2$—$B_2O_3$—$K_2O$-based glass powder, and
  the glass powder having a low softening point is a $SiO_2$—$B_2O_3$—$Bi_2O_3$-based glass powder.

7. An electronic component comprising an insulating layer disposed on a ceramic substrate and produced by firing the photosensitive glass paste according to claim 6.

8. An electronic component comprising an insulating layer disposed on a ceramic substrate and produced by firing the photosensitive glass paste according to claim 1.

* * * * *